(12) United States Patent
Chang et al.

(10) Patent No.: US 9,390,983 B1
(45) Date of Patent: Jul. 12, 2016

(54) SEMICONDUCTOR DEVICE AND METHOD FOR FABRICATING THE SAME

(71) Applicant: Vanguard International Semiconductor Corporation, Hsinchu (TW)

(72) Inventors: Hsiung-Shih Chang, Taichung (TW); Jui-Chun Chang, Hsinchu (TW); Chih-Jen Huang, Dongshan Township (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 15/072,171

(22) Filed: Mar. 16, 2016

Related U.S. Application Data

(62) Division of application No. 14/249,959, filed on Apr. 10, 2014, now Pat. No. 9,324,785.

(51) Int. Cl.
| | |
|---|---|
| *H01L 21/00* | (2006.01) |
| *H01L 21/84* | (2006.01) |
| *H01L 29/06* | (2006.01) |
| *H01L 21/225* | (2006.01) |
| *H01L 21/324* | (2006.01) |
| *H01L 29/66* | (2006.01) |
| *H01L 29/08* | (2006.01) |

(52) U.S. Cl.
CPC ............ *H01L 21/84* (2013.01); *H01L 21/2253* (2013.01); *H01L 21/324* (2013.01); *H01L 29/0634* (2013.01); *H01L 29/0649* (2013.01); *H01L 29/0847* (2013.01); *H01L 29/66659* (2013.01); *H01L 29/66681* (2013.01)

(58) Field of Classification Search
None
See application file for complete search history.

(56) References Cited

U.S. PATENT DOCUMENTS

| 2011/0278650 A1 | 11/2011 | Tamaki et al. |
| 2012/0292689 A1 | 11/2012 | Wu et al. |

FOREIGN PATENT DOCUMENTS

| TW | 201011915 A | 3/2010 |
| TW | 201225292 A1 | 6/2012 |

*Primary Examiner* — Sonya D McCall Shepard
(74) *Attorney, Agent, or Firm* — Birch, Stewart, Kolasch & Birch, LLP

(57) ABSTRACT

A semiconductor device includes: a plurality of stacked semiconductor layers; a plurality of composite doped regions separately and parallelly disposed in a portion of the semiconductor layers along a first direction; a gate structure disposed over a portion of the semiconductor layers along a second direction, wherein the gate structure covers a portion of the composite doped regions; a first doped region formed in the most top semiconductor layer along the second direction and being adjacent to a first side of the gate structure; and a second doped region formed in the most top semiconductor layer along the second direction and being adjacent to a second side of the gate structure opposite to the first side thereof.

13 Claims, 11 Drawing Sheets

SEMICONDUCTOR DEVICE AND METHOD FOR FABRICATING THE SAME

CROSS-REFERENCE TO RELATED APPLICATIONS

This application is a Divisional of co-pending application Ser. No. 14/249,959, filed on Apr. 10, 2014, all of which are hereby expressly incorporated by reference into the present application.

BACKGROUND OF THE INVENTION

1. Field of the Invention

The present invention relates to integrated circuit (IC) devices, and particularly to a semiconductor device having a super-junction structure and a method for fabricating the same.

2. Description of the Related Art

Recently, as demand increases for high-voltage devices, such as power semiconductor devices, there has been an increasing interest in research for high-voltage metal-oxide-semiconductor field effect transistors (HV MOSFET) applied in high-voltage devices.

Among the various types of high voltage metal-oxide-semiconductor field effect transistors, a super-junction structure is often used for reducing the on-resistance (Ron) and maintaining high breakdown voltage.

However, with the trend of size reduction in semiconductor fabrication, the critical size of high-voltage MOSFETs in power semiconductor devices needs to be reduced further. Thus, a reliable high voltage MOSFET in the power semiconductor device having a reduced size is needed to meet device performance requirements such as driving currents, on-resistances, and breakdown voltages, as the needs and trends in size reduction of power semiconductor devices continue.

BRIEF SUMMARY OF THE INVENTION

An exemplary semiconductor device comprises a plurality of stacked semiconductor layers, a plurality of composite doped regions, a gate structure, a first doped region, and a second doped region. The semiconductor layers have a first conductivity type. The composite doped regions are separately disposed in parallel in a portion of the semiconductor layers along a first direction. The composite doped regions have a second conductivity type opposite to the first conductivity type. The gate structure is disposed over a portion of the semiconductor layers along a second direction, and covers a portion of the composite doped regions. The first doped region is disposed in the most top semiconductor layer along the second direction and is adjacent to a first side of the gate structure. The first doped region has the second conductivity type. The second doped region is formed in the most top semiconductor layer along the second direction and is adjacent to a second side of the gate structure opposite to the first side. The second doped region has the second conductivity type.

An exemplary method for fabricating a semiconductor device comprises the following steps: (a) providing a semiconductor-on-insulator (SOI) substrate, comprising a bulk semiconductor layer, a buried insulating layer over the bulk semiconductor layer, and a first semiconductor layer over the buried insulating layer, wherein the first semiconductor layer has a first conductivity type; (b) forming a first implanted region in a plurality of parallel and separated portions of the first semiconductor layer, wherein the first implanted region comprises a second conductivity type opposite to the first conductivity type; (c) forming a second semiconductor layer over the first semiconductor layer; (d) forming a second implanted region in a plurality of parallel and separated portions of the second semiconductor layer, wherein the second implanted region is disposed over the first implanted region, and has the second conductivity type; (e) performing a thermal diffusion process to diffuse the first implanted region in the first semiconductor layer and the implanted region in the second semiconductor layer into a first doped region and a second doped region, respectively; and (f) forming a gate structure over a portion of the second semiconductor layer, a third doped region in a portion of the second semiconductor layer at a first side of the gate structure, and a fourth doped region in a portion of the second semiconductor layer at a second side opposite to the first side of the gate structure, wherein the gate structure extends over the second semiconductor layer along a second direction, and the third doped region and the fourth doped region have the second conductivity type.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
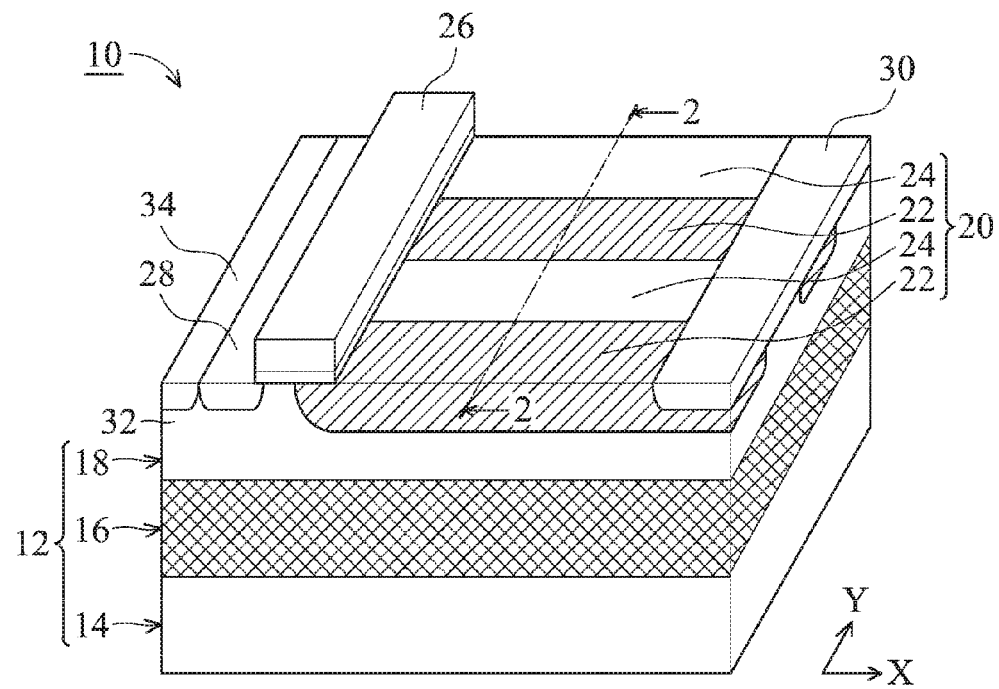
FIG. 1 is a schematic perspective view of a semiconductor device according to an embodiment of the invention.

FIG. 1 is a schematic perspective view showing an exemplary semiconductor device 10 having a lateral super junction structure.

Herein, the semiconductor device 10 is a comparative embodiment and is illustrated as a metal-oxide-semiconductor field effect transistor (MOSFET) configuration to discuss issues such as the driving-current reduction that take place as the size of the semiconductor device 10 is reduced. However, the scope of the semiconductor device of the invention is not limited by the illustrated semiconductor device 10 and may have other configurations.

As shown in FIG. 1, the semiconductor device 10 comprises a semiconductor-on-insulator (SOI) substrate 12, and the SOI substrate 12 comprises a bulk semiconductor layer 14, and a buried insulating layer 16 and a semiconductor layer 18 sequentially formed over the bulk semiconductor layer 14. The bulk semiconductor layer 14 and the semiconductor layer 18 may comprise semiconductor materials such as silicon. The buried insulating layer 16 may comprise insulating materials such as silicon dioxide. The semiconductor layer 18 may comprise dopants of a first conductivity type, such as P-type. In the semiconductor device 10, a super junction structure 20 is formed in a portion of the semiconductor layer 18, comprising a plurality of adjacent doped regions 22 and 24 which are laterally and alternately disposed. The doped regions 24 are a portion of the semiconductor layer 18 that have the same conductive type of the semiconductor layer 18. The doped regions 22 are doped regions comprising dopants of a second conductivity type opposite to the first conductivity type, such as N-type, and can be formed in various portions of the semiconductor layer 18 by, for example, an ion implantation process. The doped regions 22 may function as a drift region of the semiconductor device 10. In addition, a gate structure 26 is formed over a portion of the semiconductor layer 18, and two adjacent doped regions 28 and 34, and a doped region 30 are formed in a portion of the semiconductor layer 18 at opposite sides of the gate structure 26. The doped region 34 is a doped region having the first conductivity type of the semiconductor layer 18, and the doped regions 28 and 30 are doped regions having the second conductivity type opposite to the first conductivity type of the semiconductor layer 18 for functioning as source and drain regions, respectively. The gate structure 26 extends over a portion of the semiconductor layer 18 along the Y direction in FIG. 1 and partially covers the doped regions 22 and 24 of the super-junction structure 20. The doped region 30 is disposed in a portion of the doped regions 22 and 24 and is surrounded by the doped regions 22 and 24. The doped regions 28 and 34 are disposed in a well region 32 and are surrounded by the well region 32. The well region 32 is a portion of the semiconductor layer 18 adjacent to the doped regions 28 and 34 and is partially covered by the gate structure 26. The well region 32 comprises dopants of the first conductivity type of the semiconductor layer 18, and a bottom portion thereof contacts the top portion of the buried insulating layer 16. The doped regions 28 and 34 in the well region 32 are surrounded by the well region 32.

Figure 2:
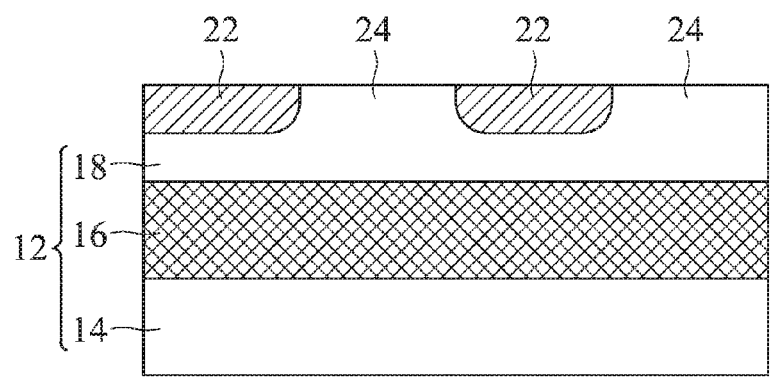
FIG. 2 is a schematic cross-sectional view showing a cross section along the line 2-2 in FIG. 1.

In FIG. 2, a schematic cross-sectional view along the line 2-2 in FIG. 1 is illustrated. As shown in FIG. 2, due to the use of the super-junction structure 20 formed by the doped regions 22 and 24 which are alternately disposed, the semiconductor device 10 is thus suitable for high-voltage operation applications such as power semiconductor devices.

However, the doped regions 22 are formed by performing ion implantation and diffusion processes to various portions of the semiconductor layer 18. Thus, as the size of the semiconductor device 10 is reduced, the device size such as the surface area of the semiconductor device 10 will also be reduced, such that the area for forming the doped regions 22 will be also reduced. Due to driving currents of the semiconductor device 10 being in proportion to the sum of the cross-sectional area of the doped regions 22 in the semiconductor layer 18, reduction of the area for forming the doped regions 22 may also reduce the driving currents and increase the on-resistance of the semiconductor device 10. Thus, the surface area of the doped regions 22 needs to be increased to maintain or improve the driving currents of the semiconductor device 10, which is variant of the size reduction of the semiconductor device 10.

Thus, an improved semiconductor device having a super-junction structure and a method for fabricating the same are provided to maintain or improve driving currents of the semiconductor device, and maintain or reduce the on-resistance of the semiconductor device as a size thereof is further reduced.

FIGS. 3-20 are schematic diagrams showing an exemplary method for fabricating a semiconductor device, wherein FIGS. 3, 5, 8, 11, 14, and 18 are schematic top views, and FIGS. 4, 6-7, 9-10, 12-13, 19-20 are schematic cross sectional views along predetermined lines in FIGS. 3, 5, 8, 11, 14, and 18, respectively, thereby showing fabrications in intermediate steps in the method for fabricating the semiconductor device.

Figure 3:
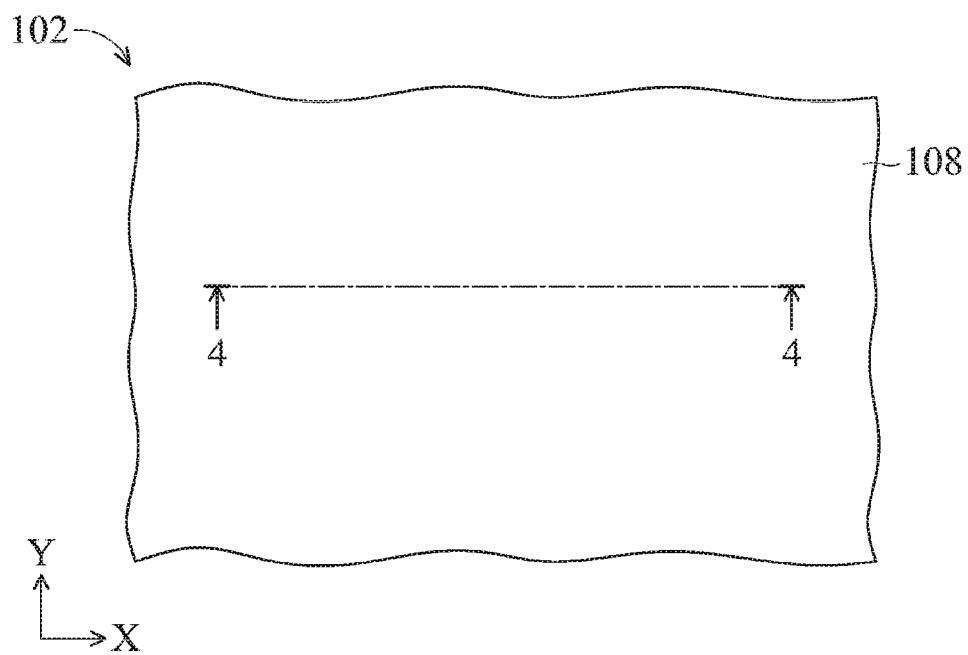
FIGS. 3, 5, 8, 11, 14, and 18 are schematic top views showing a method for fabricating a semiconductor device according to an embodiment of the invention.
Figure 4:
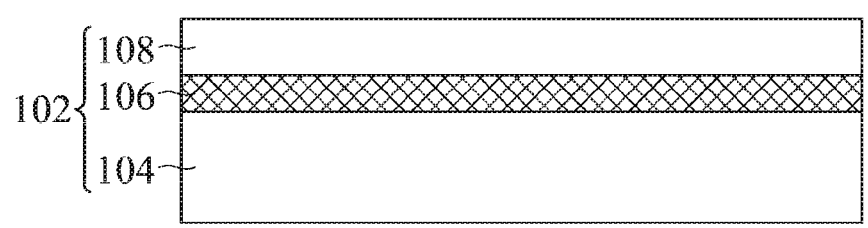
FIG. 4 is a schematic cross-sectional view showing a cross section along the line 4-4 in FIG. 3.

In FIGS. 3-4, a semiconductor substrate 102 is provided first. FIG. 3 shows a schematic top view of the semiconductor substrate 102, and FIG. 4 is a schematic cross sectional view along the line 4-4 in FIG. 3.

As shown in FIG. 4, the semiconductor substrate 102 is, for example, a semiconductor-on-insulator (SOI) substrate. The semiconductor substrate 102 comprises a bulk semiconductor layer 104, and a buried insulating layer 106 and a semiconductor layer 108 sequentially over the bulk semiconductor layer 104. The bulk semiconductor layer 104 and the semiconductor layer 18 may comprise semiconductor materials such as silicon. The buried insulating layer 16 may comprise insulating materials such as silicon dioxide. The semiconductor layer 18 may comprise dopants of a first conductivity type such as P-type or N-type.

Figure 5:
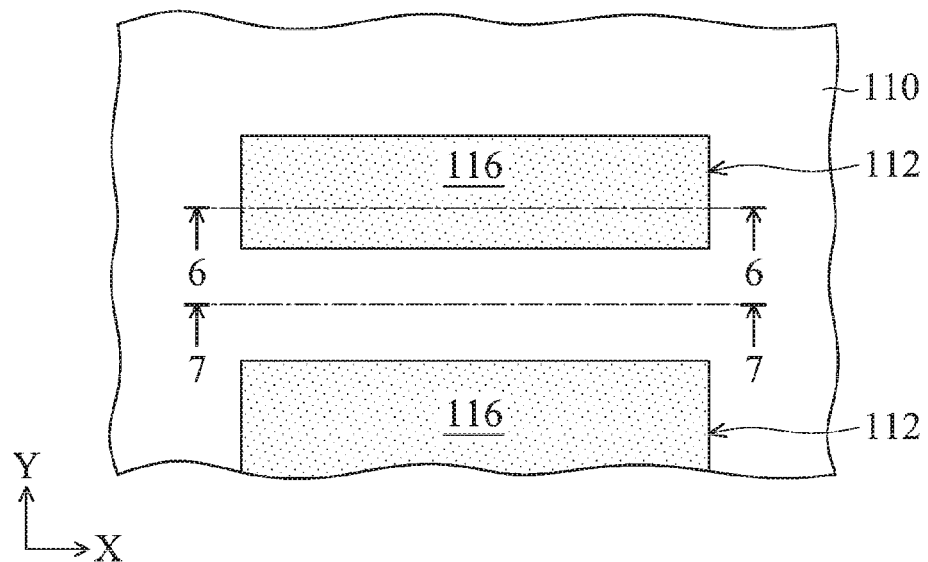
Figure 6:
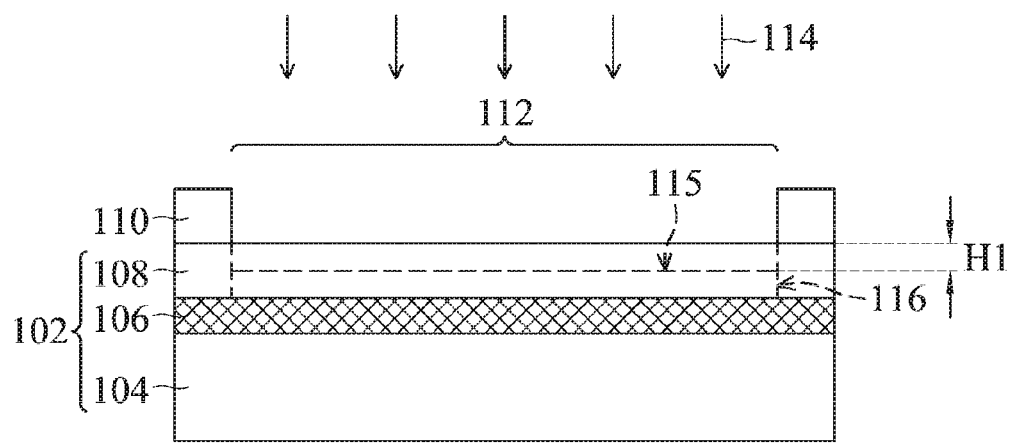
FIG. 6 is a schematic cross-sectional view showing a cross section along the line 6-6 in FIG. 5.
Figure 7:
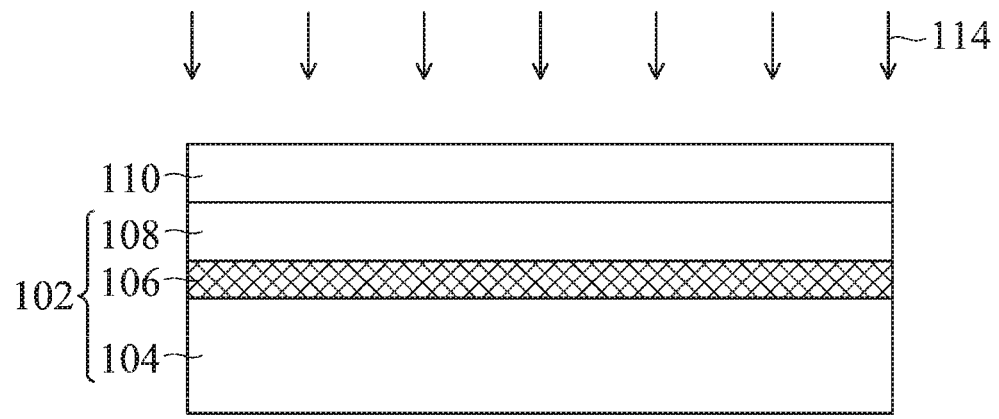
FIG. 7 is a schematic cross-sectional view showing a cross section along the line 7-7 in FIG. 5.

As shown in FIGS. 5-7, a plurality of parallel and separated implanted regions 116 are next formed in the semiconductor layer 108. FIG. 5 shows a schematic top view of the semiconductor substrate 102 having the implanted regions 116, and FIGS. 6-7 are schematic cross sectional views along the lines 6-6 and 7-7 in FIG. 5, respectively.

As shown in FIG. 5-6, a patterned mask layer 110 is formed over the semiconductor layer 108, and the patterned mask layer 110 is formed with a plurality of parallel and separated openings 112 therein. The openings 112 extend along the X direction in FIG. 5 and expose a portion of the semiconductor layer 108. The patterned mask layer 110 may comprise materials such as photoresist, such that the openings 112 can be formed in the patterned mask layer 110 by processes such as photolithography and etching (not shown) incorporating with a suitable photomask (not shown). Next, an ion implanting process 114 is performed, using the patterned mask layer 110 as an implant mask, to implant dopants 115 having a second conductivity type opposite to the first conductivity type of the semiconductor layer 108 to a portion of the semiconductor layer 108 exposed by the openings 112, for example a depth H1 shown in FIG. 6. The depth H1 can be, for example, ½ of the depth of the semiconductor layer 108, and it can be adjusted according to the performed implanting process, but is not limited by those disclosed above. In addition, as shown in FIG. 7, a portion of the semiconductor layer 108 adjacent to the implanted region 116 is protected by the patterned mask layer 110 and is not implanted by the dopants 115 having the second conductivity type in the ion implantation process 114, thereby still having the first conductivity type.

Figure 8:
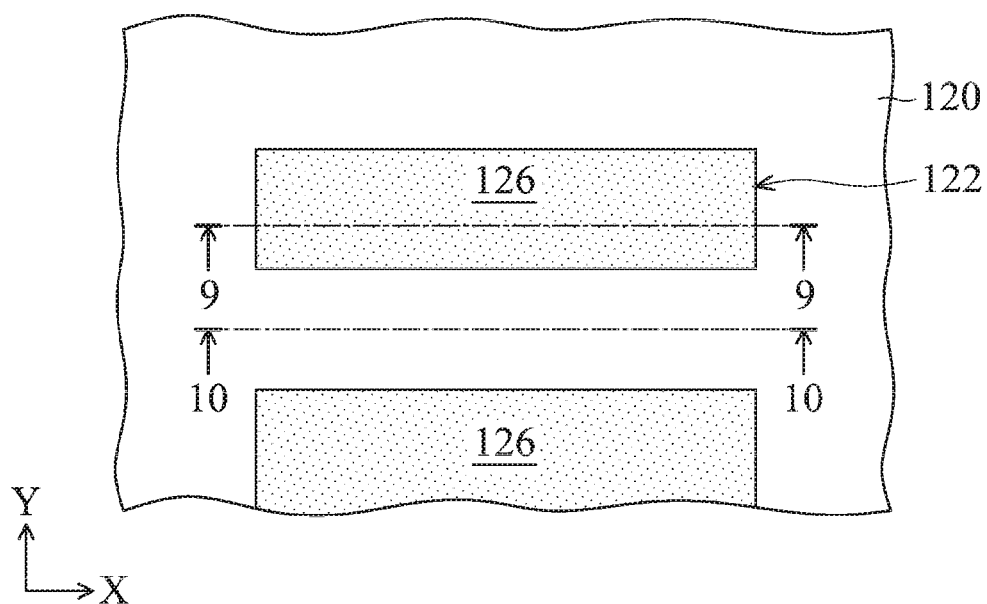
Figure 9:
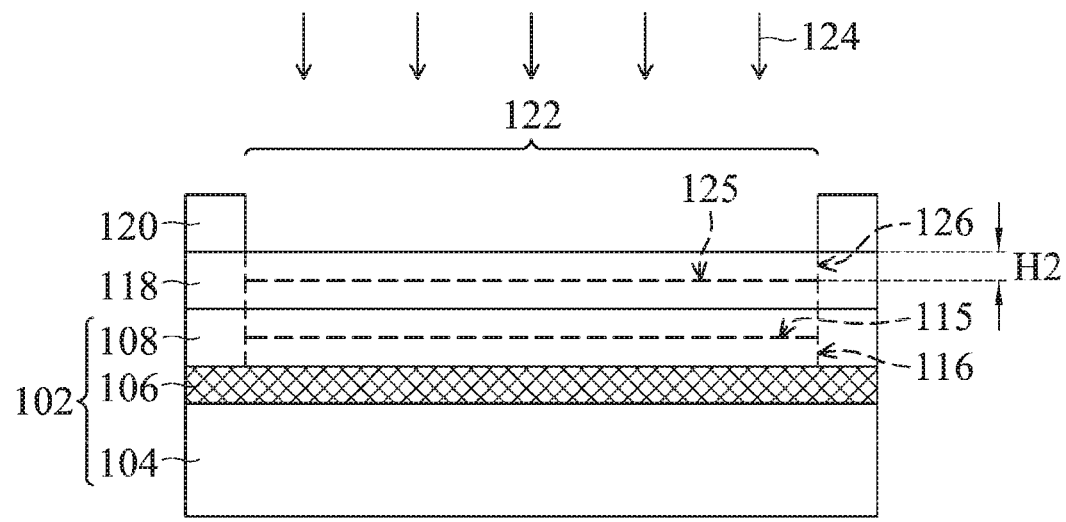
FIG. 9 is a schematic cross-sectional view showing a cross section along the line 9-9 in FIG. 8.
Figure 10:
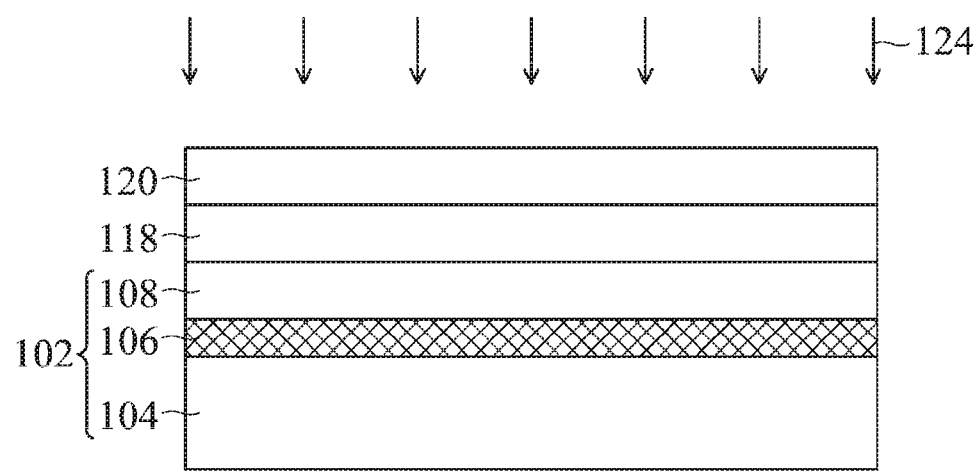
FIG. 10 is a schematic cross-sectional view showing a cross section along the line 10-10 in FIG. 8.

Referring to FIGS. 8-10, a semiconductor layer 118 is next formed over the semiconductor layer 108, and a plurality of parallel and separated implanted regions 126 are formed in the semiconductor layer 118. FIG. 8 is a schematic top view showing a semiconductor layer 118 having a plurality of implanted regions 126 therein, and FIGS. 9-10 are schematic cross sectional views along lines 9-9 and 10-10 in FIG. 8, respectively.

As shown in FIG. 8-9, after removal of the patterned mask layer 110 over the semiconductor layer 108, a semiconductor layer 118 is next formed over the semiconductor substrate 102 by a method such as an epitaxial growth process. Herein, the thickness, material and dopants of the semiconductor layer 118 can be the same as those of the semiconductor layer 108, such as silicon materials and the first conductivity type. Next, a patterned mask layer 120 is formed over the semiconductor layer 118, and a plurality of parallel and separated openings 122 are formed in the patterned mask layer 120. The openings 122 extend in the X direction in FIG. 8, and expose a portion of the semiconductor layer 118. The patterned mask layer 120 may comprise mask materials such as photoresist, such that the openings 122 can be formed by processes such as a photolithography and etching process incorporating a suitable photomask (not shown). In addition, the photomask for forming the openings 112 can also be used to form the openings 122, such that the portion of the semiconductor layer 118 exposed by each of the openings 122 is substantially located over the implanted region 116 formed in the semiconductor layer 108. Next, an ion implantation process 124 is performed, using the patterned mask layer 120 as a implanting mask, to implant dopants 125 having the second conductivity type opposite to the first conductivity type of the semiconductor layer 118 in a portion of the semiconductor layer 118 exposed by each of the openings 122, for example to a depth H2 shown in FIG. 9. The depth H2 can be, for example, ½ of the thickness of the semiconductor layer 118, and it can be adjusted according to the performed implanting processes, but are not limited to the processes described above. Moreover, as shown in FIG. 10, a portion of the semiconductor layer 118 adjacent to the implanted region 126 is still protected by the patterned mask layer 120 and is not implanted by the dopants 125 having the second conductivity type in the ion implantation process 124, thereby maintaining the first conductivity type.

Figure 11:
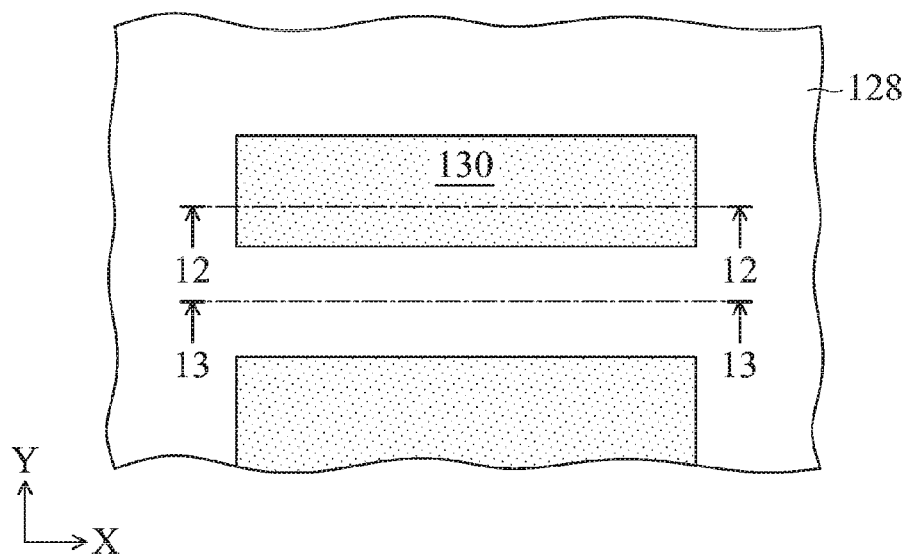
Figure 12:
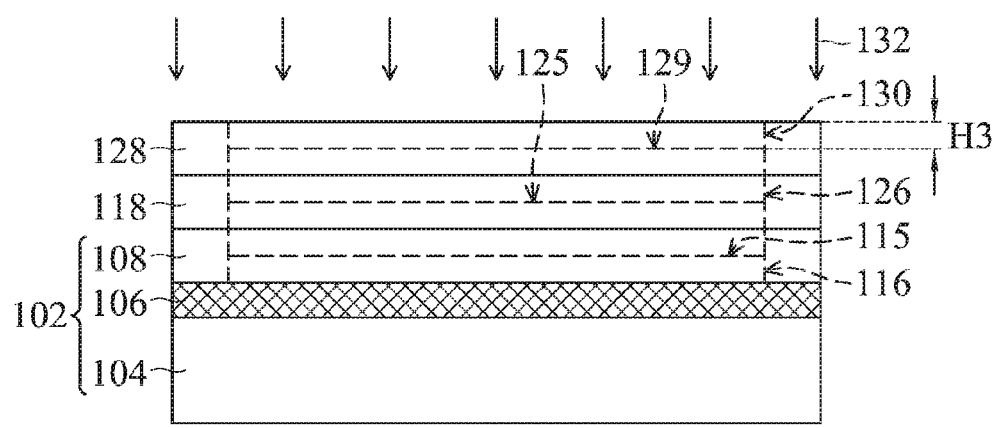
FIG. 12 is a schematic cross-sectional view showing a cross section along the line 12-12 in FIG. 11.
Figure 13:
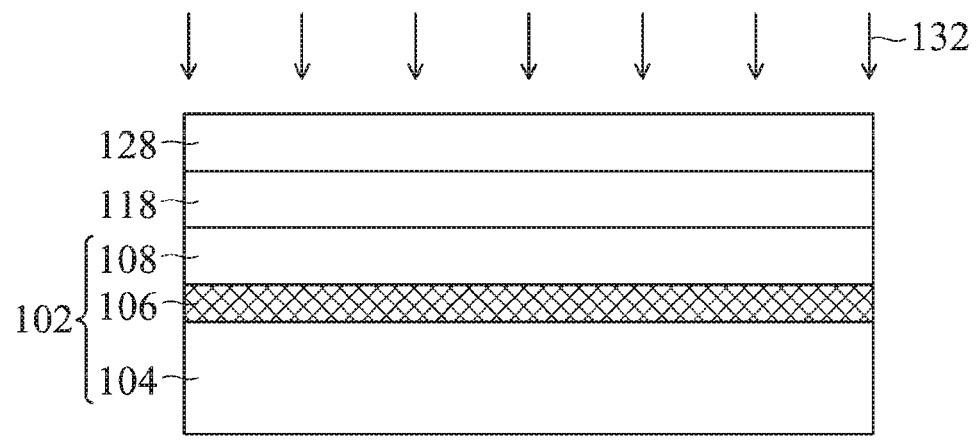
FIG. 13 is a schematic cross-sectional view showing a cross section along the line 13-13 in FIG. 11.

Referring to FIGS. 11-13, after removal of the patterned mask layer 120, a semiconductor layer 128 is next formed over the semiconductor layer 118 and a plurality of parallel and separated implanted regions 130 are formed in the semiconductor layer 128. FIG. 11 is a schematic top view showing the semiconductor layer 128 having a plurality of implanted regions 130, and FIGS. 12-13 are schematic cross sectional views along lines 12-12 and 13-13 in FIG. 11, respectively.

As shown in FIGS. 11-12, processes for forming the semiconductor layer 118 and the implanted regions 126 shown in FIGS. 8-10 can be used to form the semiconductor layer 128 and the plurality of the implanted regions 130 comprising the dopants 129. Therefore, fabrication of the semiconductor layer 128 and the implanted regions 130 are not described here again. The configurations of the semiconductor layer 128 and the implanted regions 130 are the same as those of the semiconductor layer 118 and the implanted regions 126. As shown in FIG. 12, the implanted region 130 is substantially located over the implanted region 130 and is aligned therewith, and the dopants 129 having the second conductivity type opposite to the first conductivity type of the semiconductor layer 128 are located at a place of a depth H3 in the semiconductor layer 128 in the implanted region 130. The depth H3 can be, for example, ½ of the thickness of the semiconductor layer 128, and can be adjusted according to the performing processes, but are not limited by those described above. As shown in FIG. 13, a plurality of portions of the semiconductor layer 128 adjacent to the implanted regions 130 are not formed with implanted regions 130 therein.

Next, a thermal diffusion process 132 such as an annealing process is performed to the structures shown in FIGS. 11-13 to diffuse the dopants 115, 125, and 129 in the implanted regions 116, 126, and 130 into the semiconductor layers 108, 118, and 128, respectively, as shown in FIGS. 14-17.

Referring now to FIGS. 14-17, after the thermal diffusion process 132 is performed, the dopants 115, 125, and 129 in the implanted regions 116, 126, and 130 are thus diffused into each of the semiconductor layers 108, 118, and 128, thereby forming a doped region 134, 136 and 138, which have the second conductivity type opposite to the first conductivity type of the semiconductor layers 108, 118, and 128.

Figure 14:
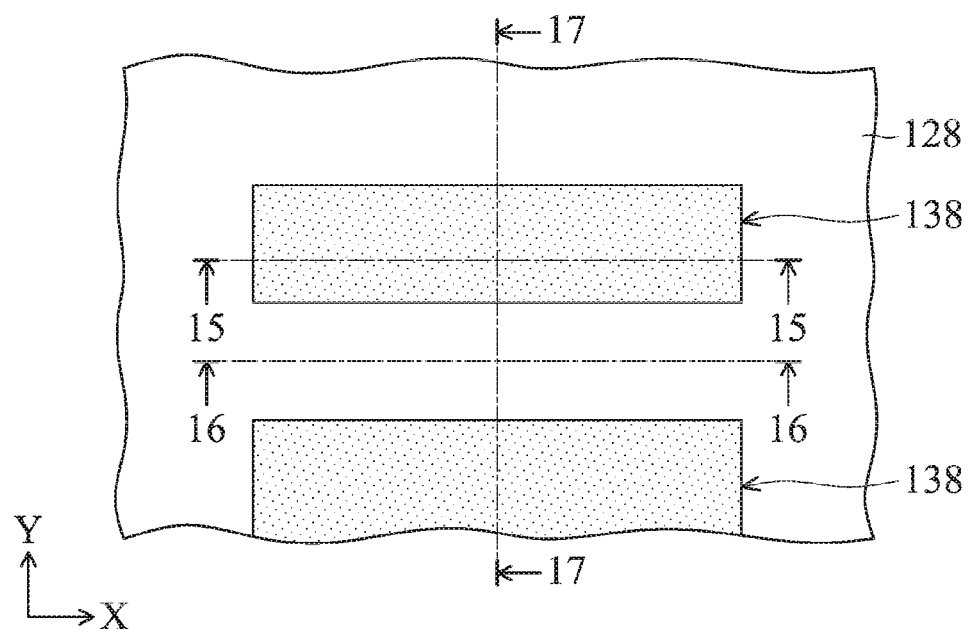
Figure 15:
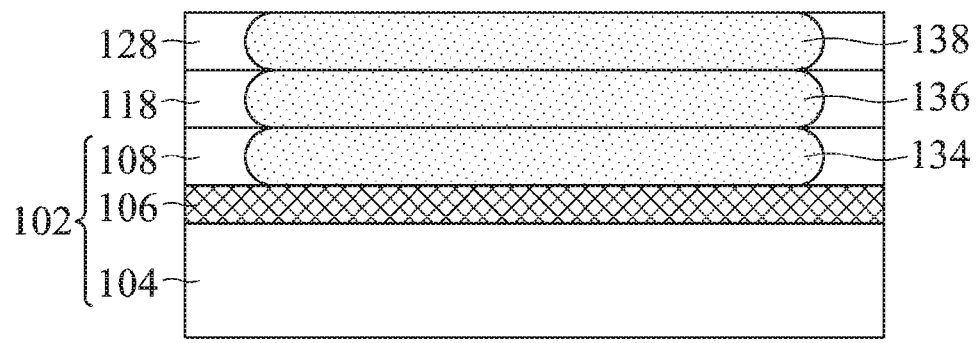
FIG. 15 is a schematic cross-sectional view showing a cross section along the line 15-15 in FIG. 14.
Figure 16:
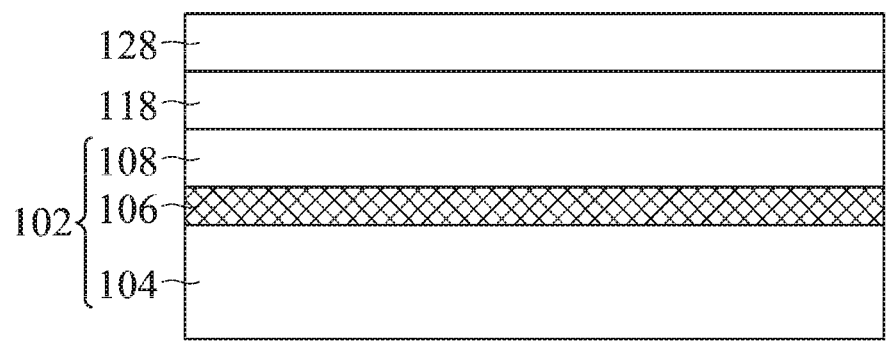
FIG. 16 is a schematic cross-sectional view showing a cross section along the line 16-16 in FIG. 14.
Figure 17:
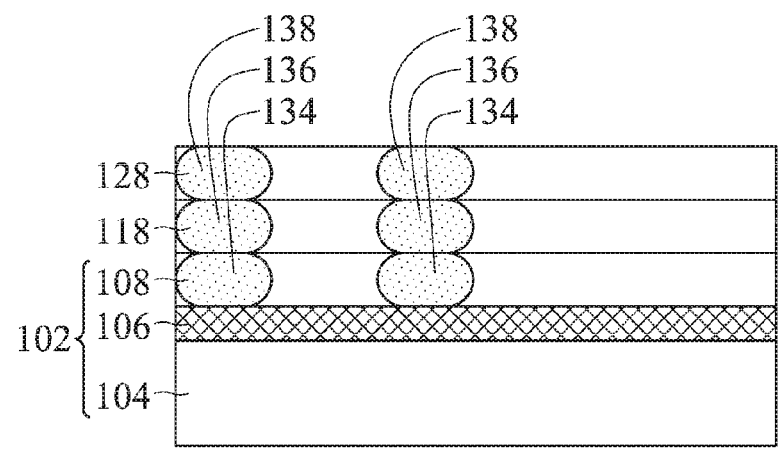
FIG. 17 is a schematic cross-sectional view showing a cross section along the line 17-17 in FIG. 14.

As shown in FIG. 14, a schematic top view of the semiconductor layer 128 and the doped regions 138 formed therein are illustrated. FIGS. 15-17 are schematic cross sectional views along the lines 15-15, 16-16, and 17-17 in FIG. 14, respectively.

As shown in FIG. 14, from the top view, the doped regions 138, 136, 134 are strip-like regions extending along the X direction in FIG. 14. In addition, as shown in FIGS. 15 and 17, the doped regions 134, 136, and 138 formed in the semiconductor layers 108, 118, and 128 are stacked over the buried insulating layer 106 from bottom to top and have a substantially oval-like configuration. The doped region 134 contacts the buried insulating layer 106, the doped region 136 contacts the doped regions 134 and 138, and the doped region 138 contacts the doped region 136. As shown in FIG. 16, the regions of the semiconductor layers 108, 118, and 128 between the adjacent doped regions 134, 136, and 138 are not formed with the doped regions 134, 136, and 138.

Figure 18:
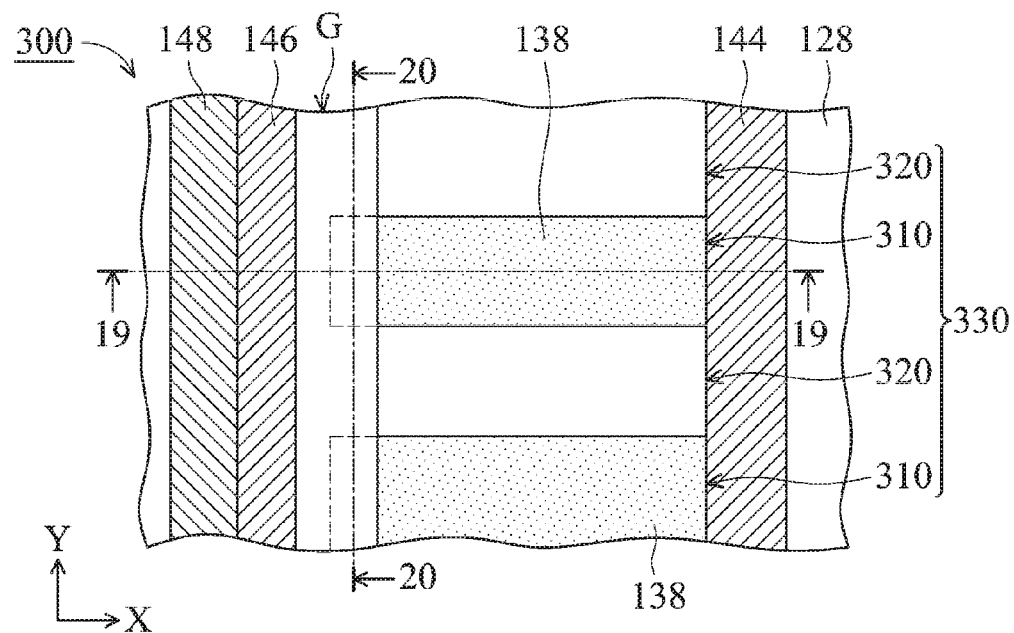
Figure 19:
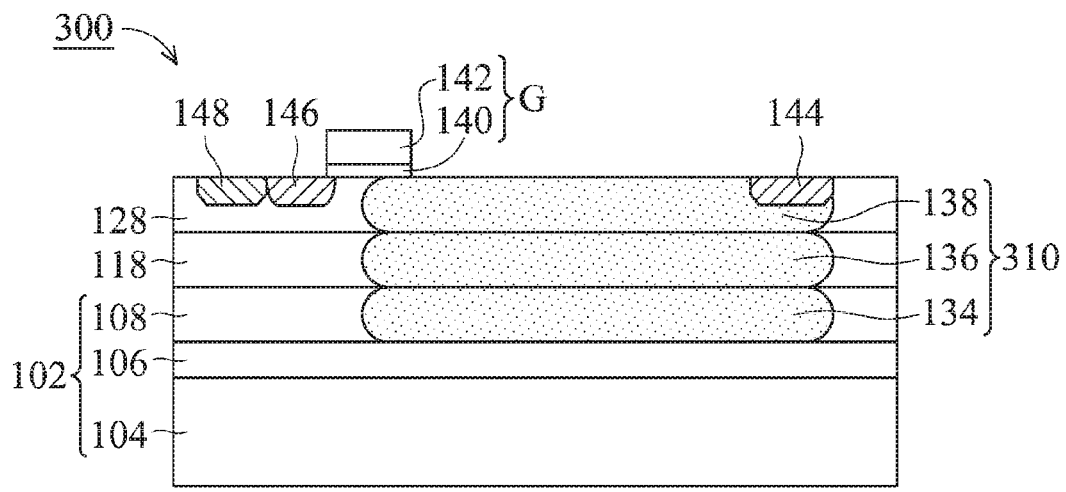
FIG. 19 is a schematic cross-sectional view showing a cross section along the line 19-19 in FIG. 18.
Figure 20:
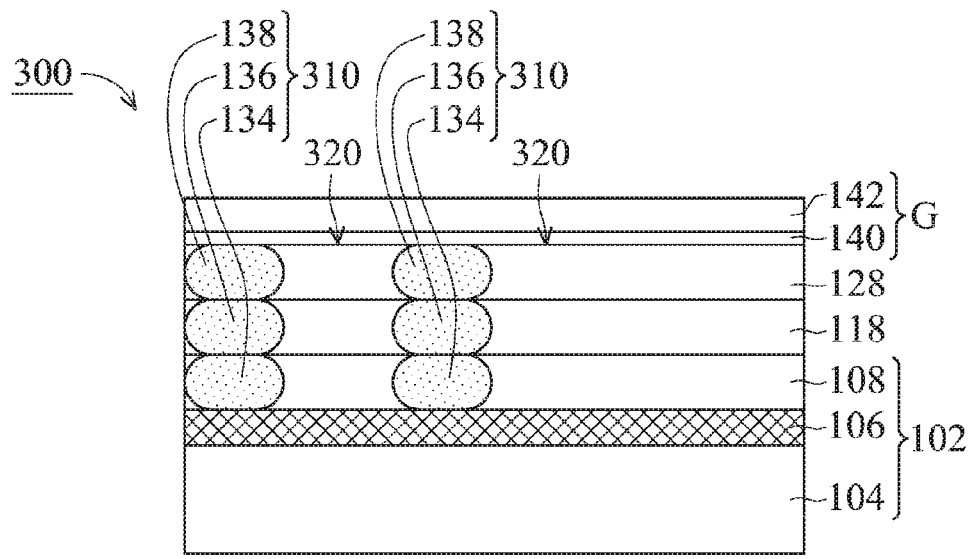
FIG. 20 is a schematic cross-sectional view showing a cross section along the line 20-20 in FIG. 18.
Figure 21:
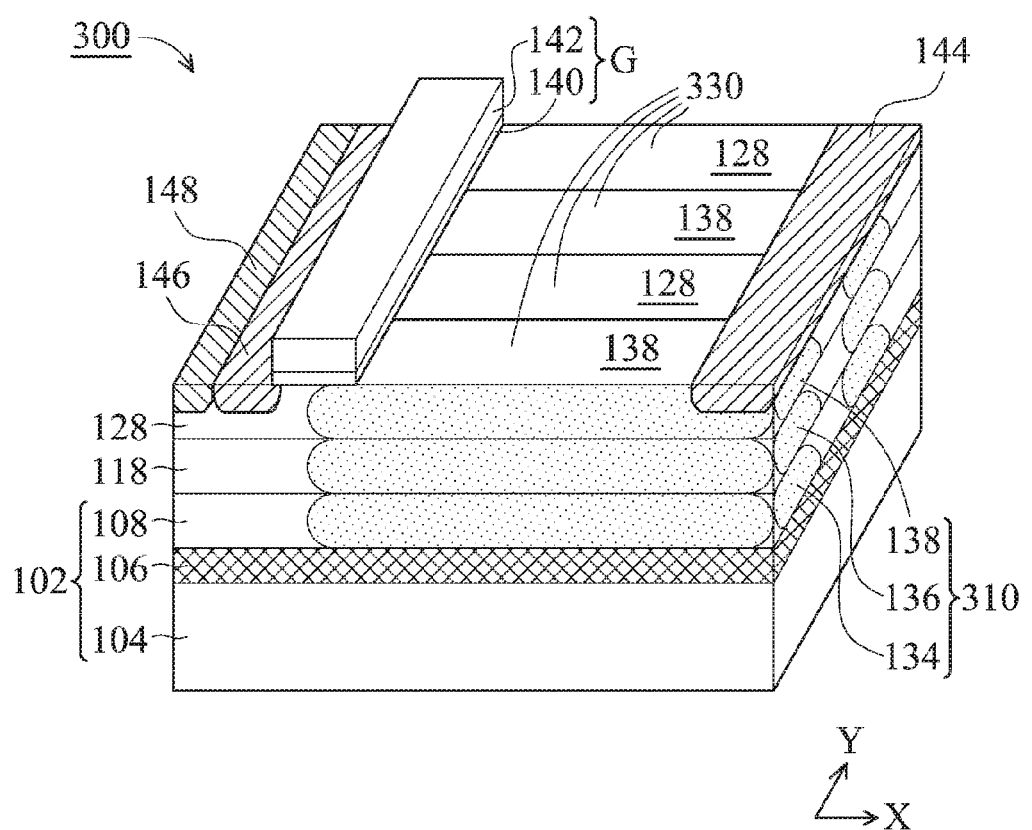
FIG. 21 is a schematic perspective view of a semiconductor device according to another embodiment of the invention.

Referring now to FIGS. 18-20, a gate structure G is next formed over the semiconductor layer 128, and doped regions 146 and 148 are formed in a portion of the semiconductor layer 128 at a side of the gate structure G, and a doped region 144 is formed in a portion of the semiconductor layer 128 at another side of the gate structure G. FIG. 18 is a schematic top view, and FIGS. 19-20 are schematic cross sectional views along lines 19-19 and 20-20 in FIG. 18.

As shown in FIG. 18, the gate structure G and the doped regions 144, 146, and 148 are formed over or in the semiconductor layer 128 along the Y direction in perpendicular to the X direction in FIG. 18. The gate structure G partially covers the doped regions 138 and a portion of the semiconductor layer 128 adjacent thereto, and the doped regions 146 and 148 are formed in a portion of the semiconductor layer 128 at a side adjacent to the gate structure G. The doped region 144 is formed in a portion of the semiconductor layer 128 at another side of the gate structure G, and is also disposed in a portion of the doped region 138, as shown in FIG. 19. In addition, as shown in FIGS. 19-20, the gate structure G comprises a gate dielectric layer 140 and a gate electrode layer 142 sequentially formed over the semiconductor layer 128.

Herein, fabrication of the gate dielectric layer 140 and the gate electrode layer 142 of the gate structure G and the doped regions 144, 146, and 148 shown in FIGS. 18-20 can be formed by conventional high voltage MOS processes, and the gate dielectric layer 140 and the gate electrode layer 142 may comprise materials used in conventional HV MOSFETs, such that materials and fabrications thereof are not described here, and the doped regions 144 and 146 comprising dopants having the second conductivity type opposite to the first conductivity type of the semiconductor layer 128 may function as source/drain regions, and the doped region 148 may comprise dopants of the first conductivity type of the semiconductor layer 128.

Therefore, fabrication of a semiconductor device 300 is substantially completed, and the semiconductor device 300 is a MOS transistor comprising a super-junction structure 330. The super junction structure 330 comprises a plurality of parallel and separated composite doped regions 310 composed of the doped regions 138, 136 and 134, having the second conductivity type, and a plurality of composite doped regions 320 made of the semiconductor layers 128, 118, 108 adjacent thereto, having the first conductivity type. The separated composite doped regions 310 composed of the doped regions 138, 136 and 134 may function as a drift-region of the semiconductor device 300, such that the semiconductor device 300 can sustain a high breakdown voltage.

In one embodiment, as the semiconductor layers 108, 118, and 128 of the semiconductor device 300 shown in FIGS. 18-21 have the first conductivity type such as P-type, and dopants in the doped regions having the second conductivity type are N-type dopants, such that the semiconductor device 300 formed is a PMOS transistor. Alternatively, as the semiconductor layers 108, 118, and 128 of the semiconductor device 300 shown in FIGS. 18-21 have the first conductivity type such as N-type, and dopants in the doped regions having the second conductivity type are P-type dopants, the formed semiconductor device 300 is a NMOS transistor.

When compared with the semiconductor device 10 shown in FIGS. 1-2, one or more interlayer semiconductor layers similar to the semiconductor layer 118 can be further added or deleted from the semiconductor device 300 shown in FIGS. 18-21 depending on designs such as driving currents, on-resistances and breakdown voltages, and the added semiconductor layer (not shown) and the doped regions therein can be the same as that of the semiconductor layer 118, and can be formed by the fabrication of the semiconductor layer 118 and the doped regions 126 therein shown in FIGS. 8-10, and the thermal diffusion process 132 shown in FIGS. 11-13. Therefore, due to the formation of the semiconductor layer 118 and the doped region 136 therein, without increasing the surface area of the separated composite doped regions 310 in the super junction 330 of the semiconductor device 300, film layers in the semiconductor layers and the doping regions 136 are increased to increase the cross section of the overall semiconductor layers of the composite doped region 310, thereby increasing driving currents and reducing on-resistance of the semiconductor device 300. In addition, a deep trench isolation (not shown) may be formed in the semiconductor layers of the semiconductor device 300 to surround thereof. The deep trench isolation penetrates a portion of the semiconductor layers 128, 118, and 108, and is made of insulating materials such as silicon dioxide that contacts the buried insulating layer 106. Due to the formation of the deep trench isolation, noises affecting the semiconductor device 300 can be reduced and a latch-up effect in the semiconductor device 300 is thus prevented.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a semiconductor device, comprising the steps:
 a. providing a semiconductor-on-insulator (SOI) substrate, comprising a bulk semiconductor layer, a buried insulating layer over the bulk semiconductor layer, and a first semiconductor layer over the buried insulating layer, wherein the first semiconductor layer has a first conductivity type;
 b. forming a first implanted region in a plurality of parallel and separated portions of the first semiconductor layer, wherein the first implanted region comprises a second conductivity type opposite to the first conductivity type;
 c. forming a second semiconductor layer over the first semiconductor layer;
 d. forming a second implanted region in a plurality of parallel and separated portions of the second semiconductor layer, wherein the second implanted region is disposed over the first implanted region, and has the second conductivity type;
 e. performing a thermal diffusion process to diffuse the first implanted region in the first semiconductor layer and the implanted region in the second semiconductor layer into a first doped region and a second doped region, respectively; and
 f. forming a gate structure over a portion of the second semiconductor layer, a third doped region in a portion of the second semiconductor layer at a first side of the gate structure, and a fourth doped region in a portion of the second semiconductor layer at a second side opposite to the first side of the gate structure, wherein the gate structure extends over the second semiconductor layer along a second direction, and the third doped region and the fourth doped region have the second conductivity type.

2. The method as claimed in claim 1, wherein the first conductivity type is P-type and the second conductivity type is N-type.

3. The method as claimed in claim 1, wherein the first conductivity type is N-type and the second conductivity type is P-type.

4. The method as claimed in claim 1, wherein the first doped region and the second doped region parallelly and separately formed in the first semiconductor layer and the second semiconductor layer form a plurality of composite doped regions stacked from top to bottom in the first and second semiconductor layers.

5. The method as claimed in claim 4, wherein the composite doped region and a portion of the first and second semiconductor layers adjacent thereto form a super-junction structure.

6. The method as claimed in claim 1, wherein the first and second doped regions in the first and second semiconductor layer have a substantially oval-like cross sectional configuration.

7. The method as claimed in claim 1, wherein the second semiconductor layer is formed by an epitaxial growth process.

8. The method as claimed in claim 1, wherein the first direction is perpendicular to the second direction.

9. The method as claimed in claim 1, prior to the step (e), further comprising the steps:

f. forming a third semiconductor layer over the second semiconductor layer; and g. forming a third implanted region in a plurality of parallel and separated portions in the third semiconductor layer along the first direction.

10. The method as claimed in claim 9, wherein the steps (e) and (f) comprises:

e. performing a thermal diffusion process to diffuse the first implanted region in the first semiconductor layer, the second implanted region in the second semiconductor layer, the third implanted region in the third semiconductor layer to a first doped region, a second doped region, and a third doped region, respectively; and f. forming a gate structure over a portion of the third semiconductor layer, a fourth doped region in a portion of the third semiconductor layer at a first side of the gate structure, and a fifth doped region in a portion of the third semiconductor layer at a second side opposite to the first side of the gate structure, wherein the gate structure extends over the third semiconductor layer along a second direction, and the fourth doped region and the fifth doped region have the second conductivity type.

11. The method as claimed in claim 10, wherein the first, second, and third doped regions respectively formed in the first, second, and third semiconductor layers, form a plurality of composite doped regions stacked from bottom to top in the first, second, and third semiconductor layers.

12. The method as claimed in claim 9, wherein the third semiconductor layer is formed by an epitaxial growth process.

13. The method as claimed in claim 9, wherein the first, second and third doped regions in the first, second, and third semiconductor layers have a substantially oval-like cross sectional configuration.

* * * * *